United States Patent
Baccouche et al.

(10) Patent No.: US 10,144,360 B2
(45) Date of Patent: Dec. 4, 2018

(54) RESTRAINTS CONTROL MODULE ATTACHMENT ASSEMBLY

(71) Applicant: FORD GLOBAL TECHNOLOGIES, LLC, Dearborn, MI (US)

(72) Inventors: Mohamed Ridha Baccouche, Ann Arbor, MI (US); Saied Nusier, Canton, MI (US); David James Bauch, South Lyon, MI (US); Mahmoud Yousef Ghannam, Canton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/159,242

(22) Filed: May 19, 2016

(65) Prior Publication Data
US 2017/0334362 A1 Nov. 23, 2017

(51) Int. Cl.
*F16M 13/00* (2006.01)
*B60R 11/00* (2006.01)
*B60R 21/013* (2006.01)
*H05K 5/02* (2006.01)
*B60R 21/01* (2006.01)

(52) U.S. Cl.
CPC ............ *B60R 11/00* (2013.01); *B60R 21/013* (2013.01); *H05K 5/0204* (2013.01); *B60R 2011/0029* (2013.01); *B60R 2011/0042* (2013.01); *B60R 2021/01006* (2013.01)

(58) Field of Classification Search
USPC ....................................................... 248/548
See application file for complete search history.

(56) References Cited

U.S. PATENT DOCUMENTS

| | | | | |
|---|---|---|---|---|
| 4,218,724 A | * | 8/1980 | Kaufman | H05K 5/0091 361/709 |
| 4,481,525 A | | 11/1984 | Calabro et al. | |
| 4,636,580 A | * | 1/1987 | Neidig | H01L 23/32 174/16.3 |
| 5,008,487 A | | 4/1991 | Shimmyo | |
| 5,398,157 A | * | 3/1995 | Paul | G06F 1/184 248/221.11 |
| 5,650,567 A | | 7/1997 | Ueda et al. | |
| 5,819,592 A | * | 10/1998 | Lewandowski | B62D 1/195 280/777 |

(Continued)

FOREIGN PATENT DOCUMENTS

| | | |
|---|---|---|
| JP | 2011234494 A | 11/2011 |
| JP | 2011234495 A | 11/2011 |

*Primary Examiner* — Monica E Millner
(74) *Attorney, Agent, or Firm* — Jason Rogers; Brooks Kushman P.C.

(57) ABSTRACT

A bracket and restraints control module assembly attached to the tunnel in the floor of a vehicle. The bracket includes a base plate and an intermediate plate supporting the restraints control module. The intermediate plate defines a plurality of holes and is secured by a limited slip connector assembly that extend through laterally elongated slots defined by the base plate and holes in the intermediate plate, respectively. The connector assembly is tightened to a predetermined level of torque so that the intermediate plate can slide relative to the base plate on upper and lower slide surfaces when a collision force of sufficient magnitude is applied to the bracket and RCM assembly.

15 Claims, 4 Drawing Sheets

(56) References Cited

U.S. PATENT DOCUMENTS

| | | | |
|---|---|---|---|
| 5,950,973 A * | 9/1999 | Verma | B60R 11/00 |
| | | | 248/221.11 |
| 6,520,357 B1 * | 2/2003 | Kautz | B65G 1/023 |
| | | | 211/151 |
| 6,728,110 B2 | 4/2004 | Koyama | |
| 6,816,381 B2 | 11/2004 | Takeuchi | |
| 7,051,825 B2 | 5/2006 | Masui et al. | |
| 7,078,620 B2 | 7/2006 | Ikeda et al. | |
| 7,244,141 B2 * | 7/2007 | Yamane | H05K 7/026 |
| | | | 361/719 |
| 7,255,597 B2 * | 8/2007 | Nakamura | H05K 5/0204 |
| | | | 439/535 |
| 7,291,023 B1 | 11/2007 | Still et al. | |
| 7,424,347 B2 * | 9/2008 | Babala | B60G 17/019 |
| | | | 701/1 |
| 7,510,404 B2 | 3/2009 | Koyama | |
| 7,651,132 B2 | 1/2010 | Cho et al. | |
| 7,654,864 B2 * | 2/2010 | Ishiguro | H05K 5/0204 |
| | | | 248/548 |
| 8,096,576 B2 * | 1/2012 | Azuma | B60R 21/0132 |
| | | | 280/728.2 |
| 8,269,103 B2 * | 9/2012 | Kiyota | H05K 5/0073 |
| | | | 174/50 |
| 8,338,720 B2 | 12/2012 | Burgi et al. | |
| 8,387,457 B2 | 3/2013 | Snider et al. | |
| 8,549,741 B2 | 10/2013 | Nelson et al. | |
| 8,824,151 B2 | 9/2014 | Ghannam et al. | |
| 8,830,686 B2 | 9/2014 | Nomoto | |
| 8,842,437 B2 | 9/2014 | Chang | |
| 9,139,074 B2 | 9/2015 | Jarocki | |
| 9,227,585 B1 * | 1/2016 | Barbat | B60R 19/38 |
| 9,293,870 B1 * | 3/2016 | Koczwara | H01R 12/724 |
| 9,320,156 B2 | 4/2016 | Ohmoto et al. | |
| 9,381,936 B2 * | 7/2016 | Tanaka | B62D 1/195 |
| 9,610,902 B2 * | 4/2017 | Rapa, Jr. | B60R 11/00 |
| 9,944,243 B2 | 4/2018 | Nusier et al. | |
| 2003/0205006 A1 * | 11/2003 | Conner | E01F 9/635 |
| | | | 52/98 |
| 2006/0046535 A1 | 3/2006 | Iida | |
| 2006/0049620 A1 * | 3/2006 | Lee | B62D 1/195 |
| | | | 280/777 |
| 2007/0013183 A1 * | 1/2007 | Jensen | B62D 1/195 |
| | | | 280/777 |
| 2013/0205560 A1 * | 8/2013 | Ghannam | B60R 16/0239 |
| | | | 29/426.5 |
| 2014/0353457 A1 * | 12/2014 | Ohmoto | B60R 21/01 |
| | | | 248/548 |
| 2016/0031382 A1 * | 2/2016 | Chinn | B60P 7/0815 |
| | | | 248/222.11 |
| 2016/0221512 A1 * | 8/2016 | Goodrich | F16M 13/02 |

\* cited by examiner

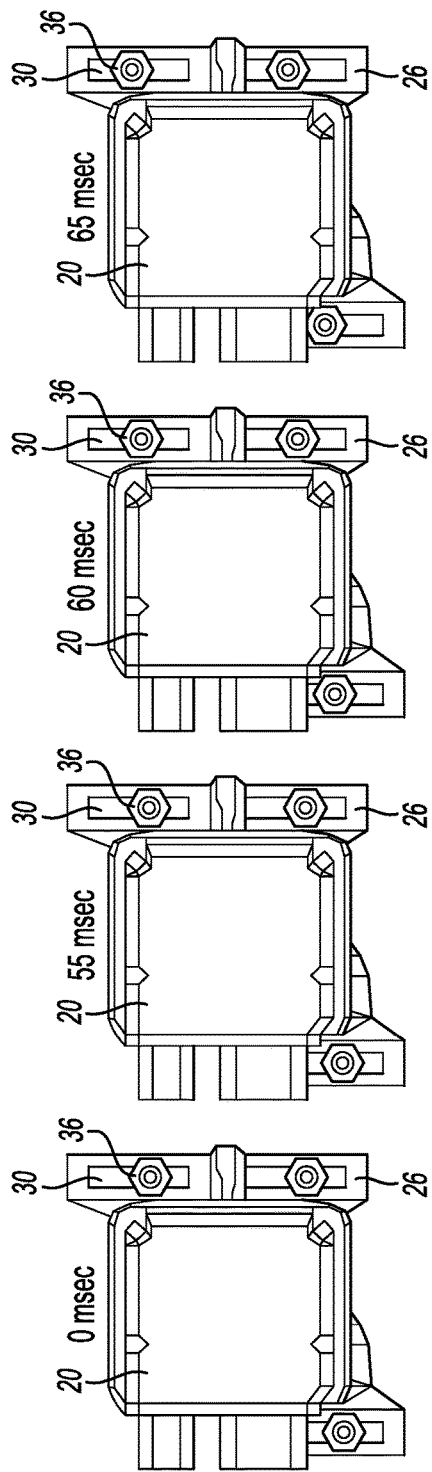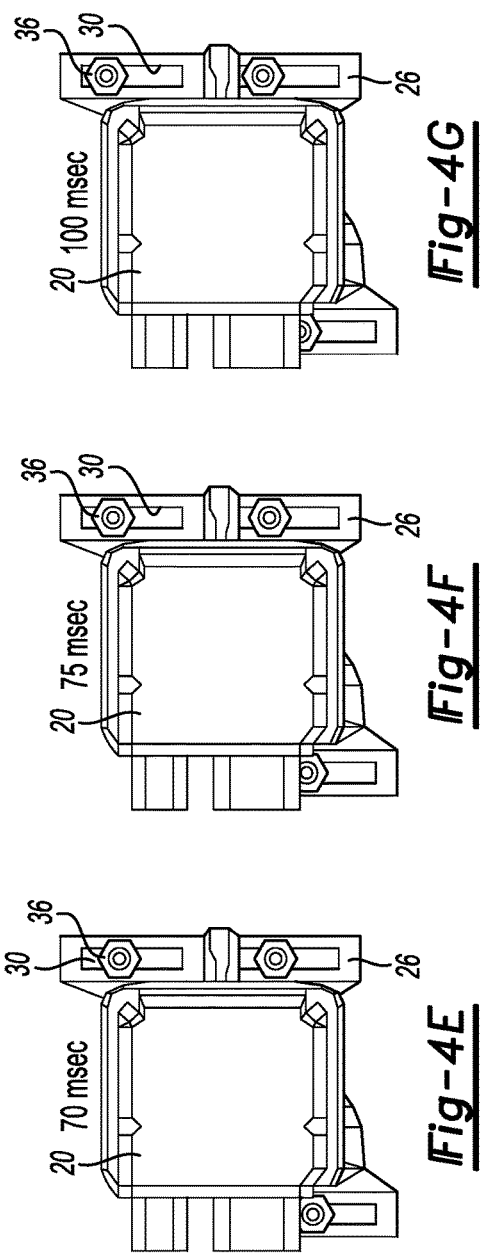

RESTRAINTS CONTROL MODULE ATTACHMENT ASSEMBLY

TECHNICAL FIELD

This disclosure relates to a mounting arrangement for a vehicle restraints control module that is attached to the tunnel or floor of a vehicle between the two front seats inside the passenger compartment.

BACKGROUND

Vehicle restraint control modules are used to control deployment of air bags or other types of safety restraints during a collision. Restraint control modules must be protected to accurately and timely deploy safety restraints. Damage to the restraints control module in a severe collision can cause the module to break or be damaged. A broken restraints control module may result in an unplanned deployment or may affect deployment timing.

Vehicles are tested in a wide variety of collision tests. As shown in FIG. 1, one type of test is the 75° Oblique Left Side Test in which a vehicle 10 is driven on a movable cart into a 10 inch pole 12 at 20.7 mph. As shown in FIG. 2, less than 10 cm of spacing may be provided between the seat track 14 and the restraints control module 16. The seat tracks 14 securing the front seats of the vehicle 10 to the floor 18 may become detached/deformed and if they move more than 10 cm may cause damage to the restraints control module 16 that is attached to the floor 18 between the seats.

The above problems and other problems are addressed by this disclosure as summarized below.

SUMMARY

According to one aspect of this disclosure, a bracket is disclosed for a restraints control module that is attached to the floor of a vehicle. The bracket comprises a base plate defining a plurality of laterally elongated slots and an intermediate plate supporting the restraints control module. The intermediate plate defines a plurality of holes and is secured by fasteners inserted into the slots and holes to facilitate shifting the intermediate plate laterally relative to the base plate if the restraints control module is contacted in a side impact collision.

According to other aspects of this disclosure, one of the fasteners may be inserted in one of the slots that is aligned with one of the holes. Each of the slots may be defined in a planar flange provided on the base plate. Each of the holes defined in the intermediate plate is provided in a flat surface on the intermediate plate that is oriented face-to-face with the planar flanges. The base plate may include two, three or more planar flanges that define the laterally elongated slots. Each of the holes defined in the intermediate plate may be provided in a flat surface on the intermediate plate that is oriented face-to-face with one of the three planar flanges.

The fasteners may be bolts that receive nuts that are tightened to a predetermined torque. The bolts have a head larger than the slots and the nuts have a larger diameter than the holes.

According to another aspect of this disclosure, a bracket is disclosed for a restraints control module. The bracket includes a base secured in a passenger compartment of a vehicle including a lower slide surface and a plate supporting a control module and attached to the base. The plate includes upper slide surfaces contacting lower slide surfaces. A limited slip connector fixedly secures the lower and upper slide surfaces together until a lateral force exceeding a predetermined level is applied to the plate causing the plate to slide laterally on the base.

The base may define either an elongate slot that extends laterally in the transverse vehicle direction or a hole and the plate may define the other of the slot or the hole.

The bracket may further comprise a plurality of lower slide surfaces on the base and a plurality of upper slide surfaces on the plate that are connected by a plurality of limited slip connectors that fixedly secure the lower and upper slide surfaces together until the lateral force exceeding a predetermined level is applied to the plate to slide the plate laterally on the base.

The limited slip connectors may include a first threaded fastener having an external thread and a second threaded fastener having an internal thread. The first and second fasteners are tightened to a predetermined torque level that establishes the predetermined level of lateral force applied to the plate to causes the plate to slide laterally on the base.

The base may be attached to a tunnel portion of a floor of the passenger compartment between two front seats of the vehicle.

The lower slide surfaces and the upper slide surfaces may be flat surfaces disposed in a horizontal plane.

The above aspects of this disclosure and other aspects are described below with reference to the attached drawings.

BRIEF DESCRIPTION OF THE DRAWINGS

FIGS. 4A-4G are top plan views of a RCM attached to a bracket/RCM assembly during a side impact collision. The sequence of views is shown progressively at different times following a collision.

DETAILED DESCRIPTION

The illustrated embodiments are disclosed with reference to the drawings. However, it is to be understood that the disclosed embodiments are intended to be merely examples that may be embodied in various and alternative forms. The figures are not necessarily to scale and some features may be exaggerated or minimized to show details of particular components. The specific structural and functional details disclosed are not to be interpreted as limiting, but as a representative basis for teaching one skilled in the art how to practice the disclosed concepts.

Figure 3A:
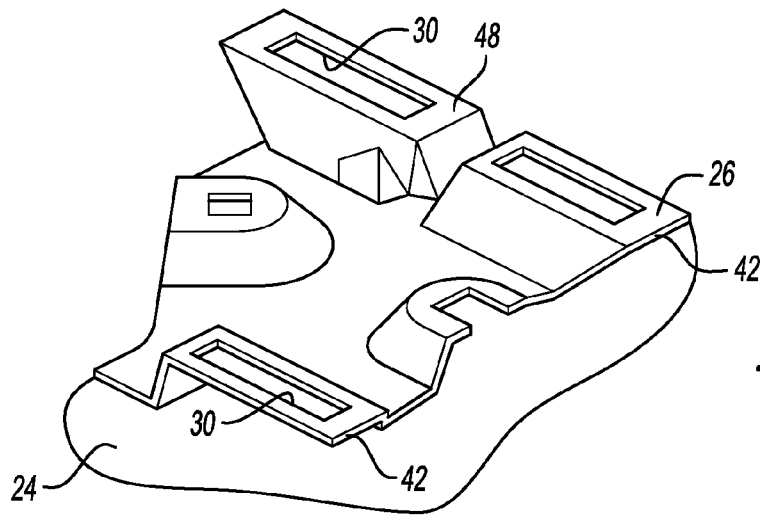
FIG. 3A is a perspective view of a base plate.
Figure 3B:
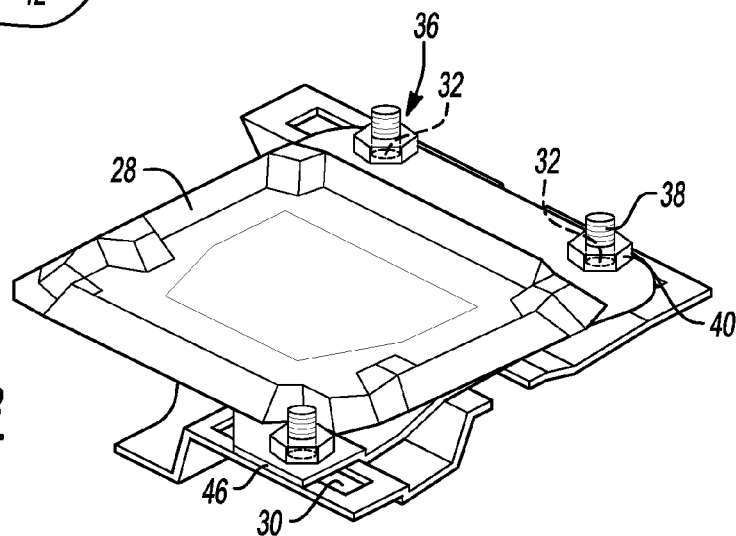
FIG. 3B is a perspective view of an intermediate plate attached to a base plate.
Figure 3C:
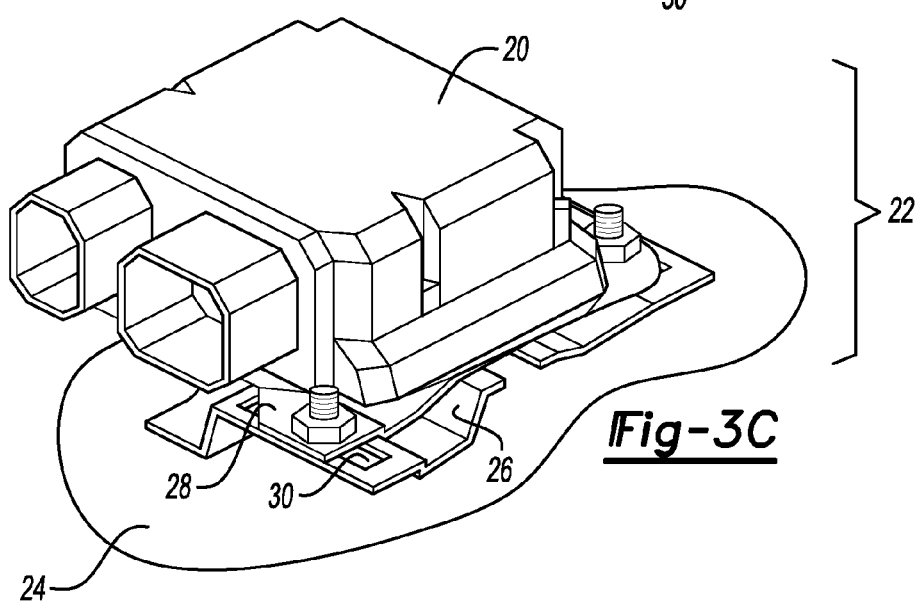
FIG. 3C is a perspective view of a bracket/restraints control module (RCM) assembly shown attached to a tunnel in a vehicle.

Referring to FIGS. 3A-3C, a restraints control module (hereinafter RCM) 20 is shown in a bracket/RCM assembly 22 that is adapted to be attached to the tunnel 24, or central portion of the vehicle floor. The bracket/RCM assembly 22 includes the RCM 20, a base plate 26, or base, and an intermediate plate 28, or plate.

Referring to FIG. 3A, the base plate 26 is attached to the tunnel 24 of the vehicle by conventional fastening techniques, such as welding, bolts, rivets, screws and the like.

The intermediate plate 28, best shown in FIG. 3B, is attached to the base plate 26. The base plate 26 includes a plurality of slots 30. The slots 30 are elongated slots that are elongated in the transverse or cross-vehicle direction. The intermediate plate 28 includes a plurality of holes 32 that are aligned with the slots 30 in the base plate 26. It should be understood that the slots 30 and holes 32 could be provided in the intermediate plate 28 and base plate 26, respectively.

A limited slip connector assembly 36 is inserted through the slots 30 and holes 32. The limited slip connector assembly 36 includes an externally threaded fastener, such as a bolt 38, and an internally threaded fastener 40, such as a nut.

The base plate 26 and intermediate plate 28 each include planar flanges 42. The slot 30 and hole 32 are provided in the planar flanges 42. The planar flanges 42 include a lower slide surface 46, or flat surface, that is provided on the intermediate plate 28. An upper slide surface 48, or flat surface, is provided on the planar flanges 42 of the base plate 26.

Figure 1:
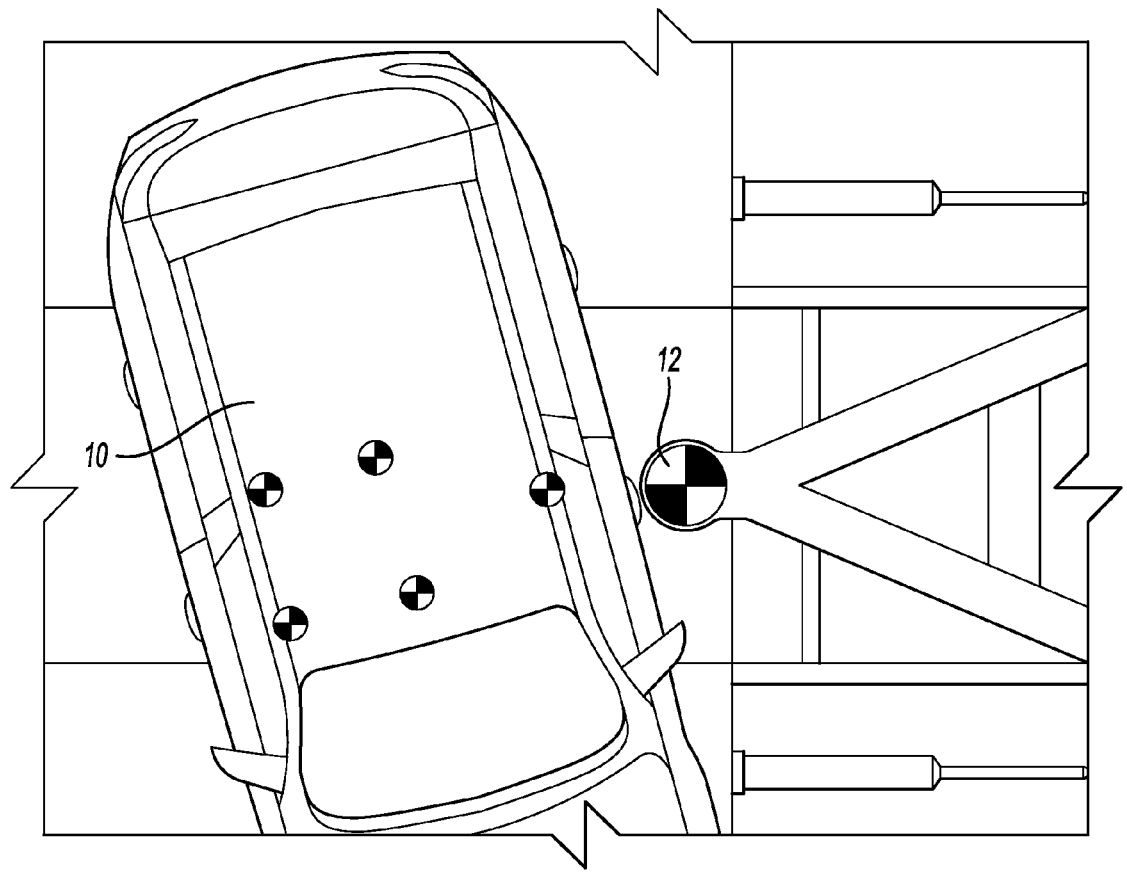
FIG. 1 is a fragmentary diagrammatic view of a 75° oblique left side test showing a vehicle being driven on a movable cart into a 10 inch pole.
Figure 2:
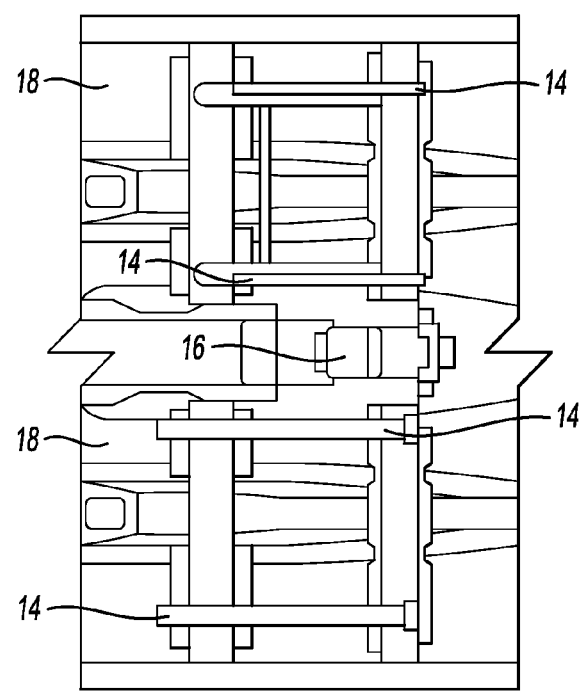
FIG. 2 is a fragmentary diagrammatic view of the front seat tracks and a restraints control module attached to the floor of a passenger compartment between the two front seats of a vehicle.

The limited slip connector assembly 36 may be tightened to a predetermined pre load level of between 3,000 and 10,000 pounds depending upon the fastener material, size and threads. The limited slip connector assembly 36 allows the RCM 20 and intermediate plate 28 to slip in a collision when the force of an impact of an object with the bracket/RCM assembly 22 exceeds a predetermined threshold level. When the restraints control module 20 slides on the intermediate plate 28 relative to the base plate 26, the RCM 20 slides further away from potential contact with objects, such as seat tracks(as shown in FIG. 2) that may become dislodged in the collision. By moving the bracket/RCM assembly 22 away from the collision, additional clearance is provided and the pulse applied to the RCM 20 is reduced.

Referring to FIGS. 4A-4G, the movement of the RCM 20 relative to the base plate 26 is shown. Initially, at 0 msec, the connector assembly 36 are shown in their normal, or as installed, position in the middle or intermediate area of the slots 30. It should be understood that the intermediate plate 28 is not shown in FIGS. 4A-4G to allow for better visibility of the movement of the connector assembly 36 relative to the slot 30.

Referring to FIG. 4B, initial movement of the RCM 20 is shown as the connector assemblies 36 begin to shift upwardly at the times shown in the view. Note, the upward direction denoted in FIGS. 4A-4G is actually the cross-car direction, or lateral direction. Referring to FIGS. 4C-4F, the connector assemblies 36 are shown to move progressively towards the upper end of the slots 30. As shown in FIG. 4G at 100 msec, the connector assemblies 36 have shifted relative to the slot 30.

Figure 5:
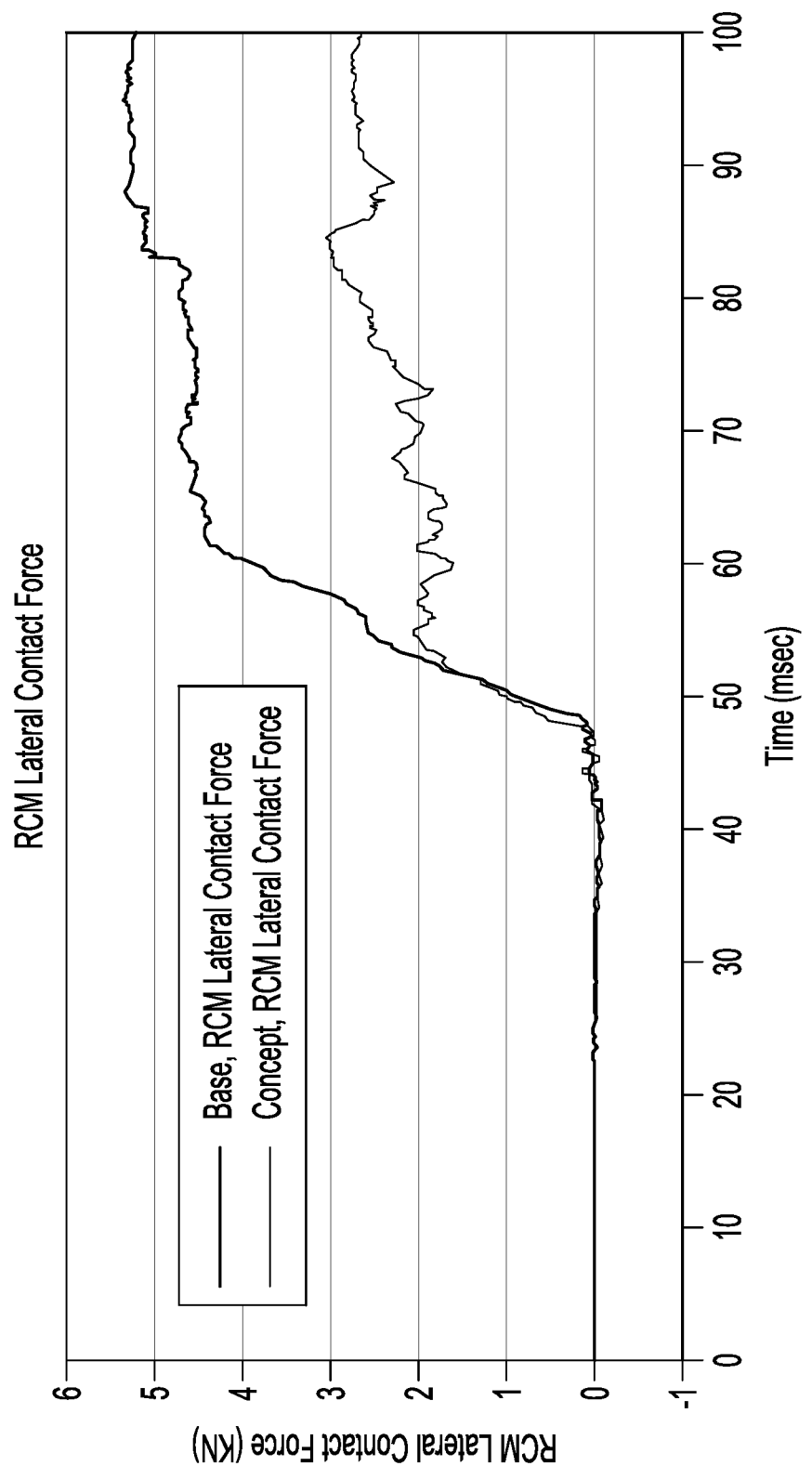
FIG. 5 is a chart of RCM lateral contact force comparing a base RCM to a bracket/RCM assembly made according to this disclosure.

Referring to FIG. 5, a chart showing the RCM lateral contact force is provided that illustrates the RCM lateral contact force in KN versus time in msec. In the collision, a lateral contact force applied to the RCM is initially zero. However, at or about 50 msec, the RCM is contacted by a seat track and a lateral impact force is applied. For the base, or prior art installation, the RCM lateral contact force rapidly increases to approximately 4.5 to 5.5 KN and may potentially result in damage to the RCM. In contrast, the concept RCM lateral contact force shown by the lower line in FIG. 5 reaches a level of between 2 and 3 KN. With a lateral contact force of between 2 and 3 KN, the possibility of damage to the RCM is substantially reduced.

The embodiments described above are specific examples that do not describe all possible forms of the disclosure. The features of the illustrated embodiments may be combined to form further embodiments of the disclosed concepts. The words used in the specification are words of description rather than limitation. The scope of the following claims is broader than the specifically disclosed embodiments and also includes modifications of the illustrated embodiments.

What is claimed is:

1. A bracket for supporting a restraints control module on a vehicle floor comprising:
    a base plate assembled to the floor and defining a plurality of cross-car elongated slots;
    an intermediate plate defining a plurality of holes;
    fasteners inserted into the slots and holes that allow the intermediate plate to slide a limited distance in a cross-car direction relative to the base plate in a side collision; and
    the restraints control module attached to the intermediate plate to slide relative to the base plate.

2. The vehicle of claim 1 wherein one of the fasteners is inserted in one of the slots that is aligned with one of the holes.

3. The vehicle of claim 1 wherein each of the slots is defined in a planar flange provided on the base plate.

4. The vehicle of claim 3 wherein each of the holes defined in the intermediate plate is provided in a flat surface on the intermediate plate that is oriented face-to-face with the planar flange.

5. The vehicle of claim 1 wherein the base plate includes three planar flanges that define three of the cross-car elongated slots.

6. The vehicle of claim 5 wherein each of the holes defined in the intermediate plate is provided in a flat surface on the intermediate plate that is oriented face-to-face with one of the three planar flanges.

7. The vehicle of claim 1 wherein the fasteners are bolts that receive nuts, wherein the nuts are tightened to a predetermined torque.

8. The vehicle of claim 7 wherein the bolts have a head larger than the slots and the nuts have a larger diameter than the holes.

9. A bracket assembly secured to a vehicle comprising:
    a base including an upper slide surface;
    a plate attached to the base supporting a control module including a lower slide surface contacting the upper slide surface; and
    a limited slip connector fixedly securing the lower and upper slide surfaces together until a side-impact force exceeding a predetermined level applied to the plate slides the plate and the control module on the base in a cross-car direction.

10. The bracket assembly of claim 9 wherein the base defines one of a slot and a hole and the plate defines the other of the slot and the hole, wherein the slot is elongate and extends cross-car in the transverse vehicle direction, and wherein the slot limits the extent that the plate and control module slide on the base plate.

11. The bracket assembly of claim 9 further comprising:
    a second lower slide surface provided on the base;
    a second upper slide surface provided on the plate; and
    a second limited slip connector fixedly securing the second lower and the second upper slide surfaces together until the side impact force exceeding a predetermined level applied to the plate slides the plate on the base in the cross-car direction.

12. The bracket assembly of claim 11 further comprising:
a third lower slide surface provided on the base;
a third upper slide surface provided on the plate; and
a third limited slip connector fixedly securing the third lower and the third upper slide surfaces together until the side impact force exceeding a predetermined level applied to the plate slides the plate on the base in the cross-car direction.

13. The bracket assembly of claim 9 wherein the limited slip connector includes a first threaded fastener having an external thread and a second threaded fastener having an internal thread wherein the first and second fasteners are tightened to a predetermined torque level that establishes the predetermined level of side impact force applied to the plate to causes the plate to slide on the base in the cross-car direction.

14. A bracket assembly in combination with a vehicle comprising:
a base including an upper slide surface;
a plate attached to the base supporting a control module and, including a lower slide surface contacting the upper slide surface; and
a limited slip connector fixedly securing the lower and upper slide surfaces together until a side-impact force exceeding a predetermined level applied to the plate slides the plate and the control module on the base in a cross-car direction wherein the base is attached to a tunnel portion of a floor of the passenger compartment between two front seats of the vehicle.

15. The bracket assembly in combination with a vehicle of claim 14 wherein the lower slide surface and the upper slide surface are flat surfaces disposed in a horizontal plane.

* * * * *